United States Patent
Lacroix et al.

(10) Patent No.: US 10,749,663 B1
(45) Date of Patent: Aug. 18, 2020

(54) METHOD AND APPARATUS FOR SIMULTANEOUS PROPAGATION OF MULTIPLE CLOCKFREQUENCIES IN SERIALIZER/DESERIALIZER (SERDES) MACROS

(71) Applicant: HUAWEI TECHNOLOGIES CO., LTD., Shenzhen, Guangdong (CN)

(72) Inventors: Marc-Andre Lacroix, Ottawa (CA); MohammadMahdi Mohsenpour, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/565,829

(22) Filed: Sep. 10, 2019

(51) Int. Cl.
- *H04L 7/033* (2006.01)
- *H03F 3/45* (2006.01)
- *H03L 7/07* (2006.01)

(52) U.S. Cl.
CPC ............ *H04L 7/0331* (2013.01); *H03F 3/45* (2013.01); *H03L 7/07* (2013.01); *H03F 2200/165* (2013.01)

(58) Field of Classification Search
CPC ... H04L 7/0331; H03F 3/45; H03F 2200/165; H03L 7/07
See application file for complete search history.

(56) References Cited

U.S. PATENT DOCUMENTS

| | | | |
|---|---|---|---|
| 9,654,123 B1* | 5/2017 | Pham | G06F 1/10 |
| 2004/0153894 A1* | 8/2004 | van der Valk | G11B 20/18 714/700 |
| 2009/0134923 A1* | 5/2009 | Kwong | H03L 7/081 327/157 |
| 2015/0091617 A1* | 4/2015 | Zerbe | H03L 7/06 327/39 |

* cited by examiner

*Primary Examiner* — Dac V Ha
(74) *Attorney, Agent, or Firm* — BCF LLP

(57) ABSTRACT

The disclosed systems, structures, and methods are directed to a two wire-based clock multiplication unit (CMU), employing a first phase lock loop (PLL) configured to generate a first high-speed clock frequency $f_1$ encoded in differential mode, a second PLL configured to generate a second high-speed clock frequency $f_2$ encoded in common mode, and a summer configured to combine the differential mode encoding the first high-speed clock frequency $f_1$ and the common mode encoding the second high-speed clock frequency $f_2$ and transmit the combined differential and common mode high-speed clock frequencies on a two wire-based conductor bus. In addition, systems, structures, and methods directed to a two wire-based clock recovery module and a two wire-based clock recovery module have also been disclosed.

27 Claims, 11 Drawing Sheets

METHOD AND APPARATUS FOR SIMULTANEOUS PROPAGATION OF MULTIPLE CLOCKFREQUENCIES IN SERIALIZER/DESERIALIZER (SERDES) MACROS

CROSS-REFERENCE TO RELATED APPLICATIONS

This is the first application filed for the instantly disclosed technology.

FIELD OF THE INVENTION

The present disclosure generally relates to the field of communication networks and, in particular, to simultaneous propagation and distribution of multiple clock frequencies in serializer/deserializer (SerDes) macros.

BACKGROUND

Wireline serial transceivers, such as, for example, serializer/deserializers (SerDess) are ubiquitous in communication networks, as they operate to connect the processing cores of integrated circuits (IC s) with other elements. In so doing, SerDess are configured to perform numerous tasks, including channel equalization, clock and data recovery, serialization and deserialization of the output/input data etc. Further, modern communication ICs may employ a large number of SerDess and clock multiplication units (CMUs), collectively known as "Macros", on single chips. However, IC designs incorporating a large number of Macros may put certain limits on the effective utilization of spatial areas and power consumption.

Moreover, the operation of the Macros generally require a reference clock, in which the reference clock frequency is converted into a high-speed clock frequency by using a phase lock loop (PLL) in order to enable synchronization with incoming data rate. Typically, this high-speed clock frequency conversion takes place in the CMU that is integrated as a separate unit from various SerDess in order to effectively utilize the available spatial area and power resources. In this configuration, the CMU is capable of supplying the high-speed clock to various SerDess within the Macros.

It will be appreciated that in certain communication networks, the data rates of individual incoming data streams may contain substantial variations, requiring the various SerDess, operating at different high-speed clock rates, to accommodate the incoming data rate variations. To combat these incoming data rate variations, various Macros employ CMUs that are configured to generate and supply different high-speed clock rates to various SerDess by employing multiple distinct busses for different high-speed clock frequency transmissions.

However, the implementation of distinct busses for different high-speed clock frequencies rates typically requires more spatial area for implementation in IC designs, resulting in increased spatial area costs. Similarly, the spatial area costs are further increased by the need to have each of the distinct busses arranged to have a certain degree of isolation from each other. Moreover, the use of multiple busses generally results in increased power consumption that is required to charge corresponding conductors. Thus, the use of distinct, multiple busses presents certain spatial area and power consumption challenges for effective IC designs.

SUMMARY

An object of the present disclosure is to provide a two wire-based clock multiplication unit (CMU). The disclosure presented herein employs a first phase lock loop (PLL) configured to generate a first high-speed clock frequency $f_1$ encoded in differential mode, a second PLL configured to generate a second high-speed clock frequency $f_2$ encoded in common mode and a summer configured to combine the differential mode encoding the first high-speed clock frequency $f_1$ and the common mode encoding the second high-speed clock frequency $f_2$ and transmit the combined differential and common mode high-speed clock frequencies on a two wire-based-conductor bus.

In accordance with other aspects of the present disclosure the two wire-based CMU, further comprising a first driver and a second driver, wherein the first driver outputs an in-phase component and an out of phase component associated with the first differential mode encoded high-speed clock frequency $f_1$ and the second driver outputs a common mode component associated with the second common mode encoded high-speed clock frequency $f_2$.

In accordance with other aspects of the present disclosure the two wire-based CMU, wherein, the summer combines the in-phase component associated with the first differential mode encoded high-speed clock frequency $f_1$ and common mode component associated with the second common mode encoded high-speed clock frequency $f_2$ and outputs a first combined component. Also, the summer transmits the first combined component on a first wire of the two wire-based conductor bus.

In accordance with other aspects of the present disclosure the two wire-based CMU, wherein the summer combine the out of phase component associated with the first differential mode encoded high-speed clock frequency $f_1$ and common mode component associated with the second common mode encoded high-speed clock frequency $f_2$ and outputs a second combined component. Also, the summer transmits the second combined component on a second wire of the two wire-based conductor bus Another object of the present disclosure is to provide a two wire-based clock recovery module. The disclosure presented herein employs a common mode rejection pre-filter configured to receive a first combined component from a first wire of a two wire-based conductor bus and receive a second combined component from a second wire of the two wire-based conductor bus, wherein: the first combined component contains an in-phase component associated with a first high-speed clock frequency $f_1$ encoded in a differential mode and a common mode component associated with a second high-speed clock frequency $f_2$ encoded in a common mode, the second combined component contains an out of phase component associated with the first differential mode encoded high-speed clock frequency $f_1$ and the common mode component associated with the second common mode encoded high-speed clock frequency $f_2$, the common mode rejection pre-filter configured to suppress the common mode components in the first and second combined component associated with the second common mode encoded high-speed clock frequency $f_2$ and outputs the differential mode components associated with the first differential mode encoded high-speed clock frequency $f_1$. A differential mode rejection pre-filter configured to receive the first combined component and the second combined component, in which the differential mode rejection pre-filter is configured to suppress the in-phase and out of phase components in the first and second combined component associated with the first differential mode encoded high-speed clock frequency $f_1$ and outputs the common mode component associated with the second common mode encoded high-speed clock frequency $f_2$. A differential amplifier configured to amplify the differential mode components associated with the first differential mode encoded high-speed clock frequency $f_1$ and outputs an amplified in-phase and out of phase component associated with the first differential mode encoded high-speed clock frequency $f_1$. A common mode amplifier configured to amplify the common mode component associated with the second common mode encoded high-speed clock frequency $f_2$ and an amplifier enabler configured to selects either the differential amplifier or the common mode amplifier for performing the amplification.

In accordance with other aspects of the present disclosure the two wire-based clock recovery module, wherein the common mode component associated with the second common mode encoded high-speed clock frequency $f_2$ is converted to an amplified differential mode component and the two wire-based clock recovery module provides either the amplified differential mode components associated with the first differential mode encoded high-speed clock frequency $f_1$ or the differential mode component associated with the second common mode encoded high-speed clock frequency $f_2$ to a plurality of transceivers.

Another object of the present disclosure is to provide a two wire-based clock amplification module. The disclosure presented herein employs a common mode rejection pre-filter configured to receive a first combined component from a first wire of a two wire-based conductor bus and receive a second combined component from a second wire of the two wire-based conductor bus, wherein: the first combined component contains an in-phase component associated with a first high-speed clock frequency $f_1$ encoded in a differential mode and a common mode component associated with a second high-speed clock frequency $f_2$ encoded in a common mode, the second combined component contains an out of phase component associated with the first differential mode encoded high-speed clock frequency $f_1$ and the common mode component associated with the second common mode encoded high-speed clock frequency $f_2$, the common mode rejection pre-filter configured to suppress the common mode components in the first and second combined component associated with the second common mode encoded high-speed clock frequency $f_2$ and outputs the differential mode components associated with the first differential mode encoded high-speed clock frequency $f_1$. A differential mode rejection pre-filter configured to receive the first combined component and the second combined component, in which the differential mode rejection pre-filter is configured to suppress the in-phase and out of phase components in the first and second combined component associated with the first differential mode encoded high-speed clock frequency $f_1$ and outputs the common mode component associated with the second common mode encoded high-speed clock frequency $f_2$. A differential amplifier configured to amplify the differential mode components associated with the first differential mode encoded high-speed clock frequency $f_1$ and outputs an amplified in-phase and out of phase component associated with the first differential mode encoded high-speed clock frequency $f_1$. A common mode amplifier configured to amplify the common mode component associated with the second common mode encoded high-speed clock frequency $f_2$. A first summer configured to combine the amplified in-phase component associated with the first differential mode encoded high-speed clock frequency $f_1$ with the amplified common mode component associated with the second common mode encoded high-speed clock frequency $f_2$ and outputs a first amplified combined component and a second summer configured to combine the amplified out of phase component associated with the first differential mode encoded high-speed clock frequency $f_1$ with the amplified common mode component associated with the second common mode encoded high-speed clock frequency $f_2$ and outputs a second amplified combined component.

In accordance with other aspects of the present disclosure the two wire-based clock amplification module, wherein the first summer transmits the first amplified combined component on the first wire of the two wire-based conductor bus and the second summer transmits the second amplified combined component on the second wire of the two wire-based conductor bus.

In accordance with other aspects of the present disclosure, there is provided a two wire-based method of generating and transmitting high-speed clock frequencies. The disclosure presented herein performs generating a first high-speed clock frequency $f_1$ encoded in differential mode, generating a second high-speed clock frequency $f_2$ encoded in common mode, combining the differential mode encoded first high-speed clock frequency $f_1$ and common mode encoded second high-speed clock frequency $f_2$ and transmitting the combined high-speed clock frequencies on a two wire-based conductor bus.

In accordance with other aspects of the present disclosure, the two wire-based method of generating and transmitting high-speed clock frequencies wherein, an in-phase component and an out of phase component associated with the first differential mode encoded high-speed clock frequency $f_1$ is computed and a common mode component associated with the second common mode encoded high-speed clock frequency $f_2$ is computed.

In accordance with other aspects of the present disclosure, the two wire-based method of generating and transmitting high-speed clock frequencies wherein, the in-phase component associated with the first differential mode encoded high-speed clock frequency $f_1$ and common mode component associated with the second common mode encoded high-speed clock frequency $f_2$ are combined, resulting in a first combined component and the first combined component is transmitted on a first wire of the two wire-based conductor bus.

In accordance with other aspects of the present disclosure, the two wire-based method of generating and transmitting high-speed clock frequencies wherein, the out of phase component associated with the first differential mode encoded high-speed clock frequency $f_1$ and common mode component associated with the second common mode encoded high-speed clock frequency $f_2$ are combined, resulting in a second combined component and the second combined component is transmitted on a second wire of the two wire-based conductor bus.

In accordance with other aspects of the present disclosure, there is provided a two wire-based method of clock recovery. The disclosure presented herein performs, receiving a first combined component from a first wire of a two wire-based conductor bus and receiving a second combined component from a second wire of the two wire-based conductor bus, wherein: the first combined component contains an in-phase component associated with a first high-speed clock frequency $f_1$ encoded in a differential mode and a common mode component associated with a second high-speed clock frequency $f_2$ encoded in a common mode, the second combined component contains an out of phase component associated with the first differential mode encoded high-speed clock frequency $f_1$ and the common mode component associated with the second common mode encoded high-speed clock frequency $f_2$. The two wire-based method of clock recovery also performs, suppressing the common mode components in the first and second combined component associated with the second common mode encoded high-speed clock frequency $f_2$ and providing the differential mode components associated with the first differential mode encoded high-speed clock frequency $f_1$, suppressing the in-phase and out of phase components in the first and second combined component associated with the first differential mode encoded high-speed clock frequency $f_1$ and providing the common mode component associated with the second common mode encoded high-speed clock frequency $f_2$, amplifying the differential mode components associated with the first differential mode encoded high-speed clock frequency $f_1$ resulting in an amplified in-phase and out of phase component associated with the first differential mode encoded high-speed clock frequency $f_1$, amplifying the common mode component associated with the second common mode encoded high-speed clock frequency $f_2$, and selecting the differential amplifier or the common mode amplifier for performing amplification.

In accordance with other aspects of the present disclosure, the two wire-based method of clock recovery wherein, the common mode component associated with the second common mode encoded high-speed clock frequency $f_2$ is converted to an amplified differential mode component. The two wire-based method of clock recovery also provides either the amplified differential mode components associated with the first differential mode encoded high-speed clock frequency $f_1$ or the differential mode component associated with the second common mode encoded high-speed clock frequency $f_2$ to a plurality of transceivers.

In accordance with other aspects of the present disclosure, there is provided a two wire-based method of clock amplification. The disclosure presented herein performs, receiving a first combined component from a first wire of a two wire-based conductor bus and receiving a second combined component from a second wire of the two wire-based conductor bus, wherein: the first combined component contains an in-phase component associated with a first high-speed clock frequency $f_1$ encoded in a differential mode and a common mode component associated with a second high-speed clock frequency $f_2$ encoded in a common mode, the second combined component contains an out of phase component associated with the first differential mode encoded high-speed clock frequency $f_1$ and the common mode component associated with the second common mode encoded high-speed clock frequency $f_2$. The two wire-based method of clock amplification also performs, suppressing the common mode components in the first and second combined component associated with the second common mode encoded high-speed clock frequency $f_2$ and providing the differential mode components associated with the first differential mode encoded high-speed clock frequency $f_1$, suppressing the in-phase and out of phase components in the first and second combined component associated with the first differential mode encoded high-speed clock frequency $f_1$ and providing the common mode component associated with the second common mode encoded high-speed clock frequency $f_2$, amplifying the differential mode components associated with the first differential mode encoded high-speed clock frequency $f_1$ resulting in an amplified in-phase and out of phase component associated with the first differential mode encoded high-speed clock frequency $f_1$, amplifying the common mode component associated with the second common mode encoded high-speed clock frequency $f_2$, combining the amplified in-phase component associated with the first differential mode encoded high-speed clock frequency $f_1$ with the amplified common mode component associated with the second common mode encoded high-speed clock frequency $f_2$ resulting in a first amplified combined component and combining the amplified out of phase component associated with the first differential mode encoded high-speed clock frequency $f_1$ with the amplified common mode component associated with the second common mode encoded high-speed clock frequency $f_2$ resulting in a second amplified combined component.

In accordance with other aspects of the present disclosure, the two wire-based method of clock recovery wherein, the first amplified combined component is transmitted on the first wire of the two wire-based conductor bus and the second amplified combined component is transmitted on the second wire of the two wire-based conductor bus.

BRIEF DESCRIPTION OF THE FIGURES

The features and advantages of the present disclosure will become apparent from the following detailed description, taken in combination with the appended drawings, in which.

Figure 1:
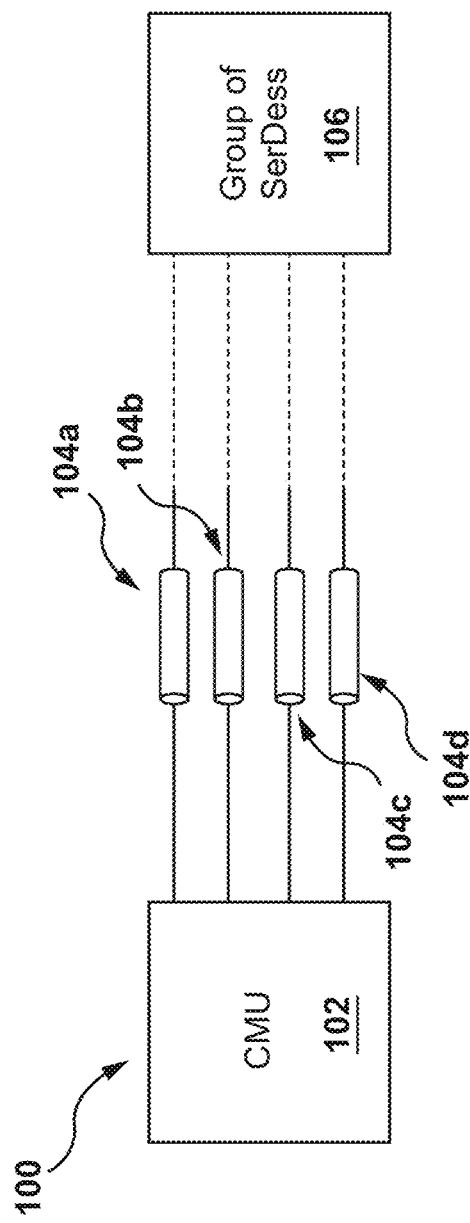
FIG. 1 (Prior Art) depicts a high-level functional block diagram of a conventional 4-wire Macro.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

Unless otherwise defined, all technical and scientific terms used herein have the same meaning as commonly understood by one of ordinary skill in the art to which the described embodiments appertain to.

FIG. 1(Prior Art) depicts a high-level functional block diagram of a conventional four wire-based Macro 100 directed to generating and transmitting multi-rate high-speed clock frequencies to group of SerDes 106. The conventional four wire-based Macro 100 includes a clock multiplication unit (CMU) 102, wires 104a and 104b corresponding to a first bus, wires 104c and 104d corresponding to a second bus and a group of SerDes 106. It will be understood that other elements may be present, but are not illustrated for the purpose of tractability and simplicity.

As shown in FIG. 1, CMU 102 may further include multiple phase lock loop (PLL) to generate different high-speed clock frequencies and transmit the generated high-speed clock frequencies to group of SerDes 106. In so doing, CMU 102 encodes a first high-speed clock frequency as a time varying potential difference between wires 104a and 104b and transmits the encoded first high-speed clock frequency on wires 104a and 104b.

Similarly, CMU 102 encodes a second high-speed clock frequency as a time varying potential difference between wires 104c and 104d and transmits the encoded second high-speed clock frequency on wires 104c and 104d. Further, each coupled wires 104a and 104b and wires 104c and 104d forms a differential bus independent from each other. Each differential bus is used to transmit single high-speed clock frequency.

Thus, as shown, the conventional implementation requires CMU 102 to incorporate a four-wire structure in order to transmit two high-speed clock frequencies. The integration of a four wire-based structure in Macros requires additional spatial area. Moreover, to reduce the effects of inter-bus interference, CMU 102 may further require proper isolation between the busses for efficient transmission of high-speed clock frequencies to group of SerDes 106, which contributes to additional area requirements. In addition, if CMU 102 requires shielding to mitigate isolation, then the overall power consumption may increases.

Although, conventional four wire-based Macros 100 generates and transmits multi-rate high-speed clock frequencies to group of SerDes 106, such implementation compromises the effective utilization of available spatial area and power for designing ICs incorporating CMUs and multiple SerDes.

Figure 2:
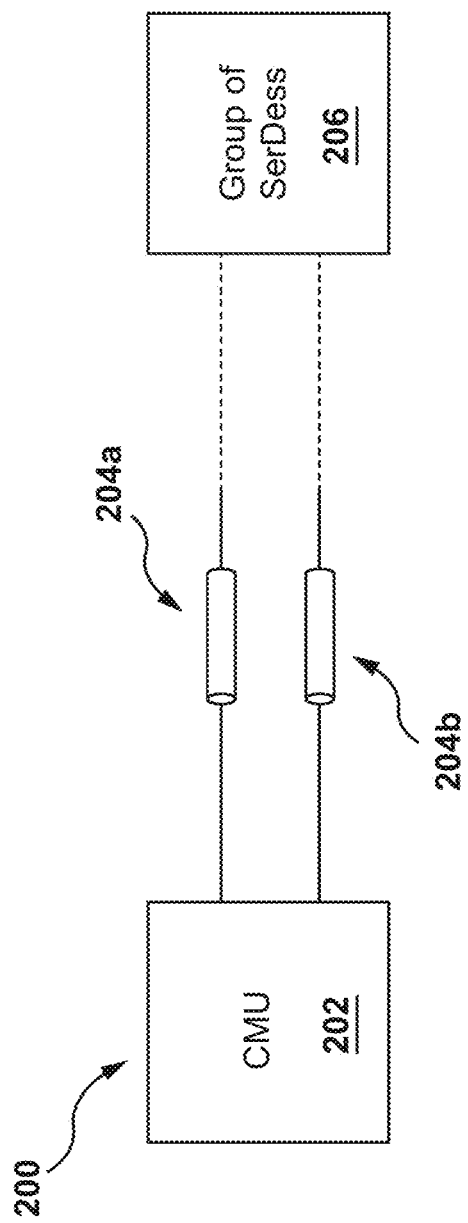
FIG. 2 depicts a high-level functional block diagram of a two wire-based Macro, in accordance with various embodiments of present disclosure.

To this end, FIG. 2 depicts a high-level functional block diagram of a two wire-based Macro 200 directed to generating and transmitting multi-rate high-speed clock frequencies to group of SerDes 206, in accordance with various embodiments of present disclosure. The two wire-based Macro 200 may include a clock multiplication unit (CMU) 202, conductor bus wires 204a and 204b and a group of SerDes 206. It will be understood that other elements may be present, but are not illustrated for the purpose of tractability and simplicity.

As shown in FIG. 2, CMU 202 may include multiple phase lock loop (PLL) to generate different high-speed clock frequencies and transmit the generated high-speed clock frequencies to group of SerDes 206. In so doing, CMU 202 encodes a first high-speed clock frequency and a second high-speed clock frequency and transmits the encoded first high-speed clock frequency and second high-speed clock frequency on wires 204a and 204b.

Figure 3:
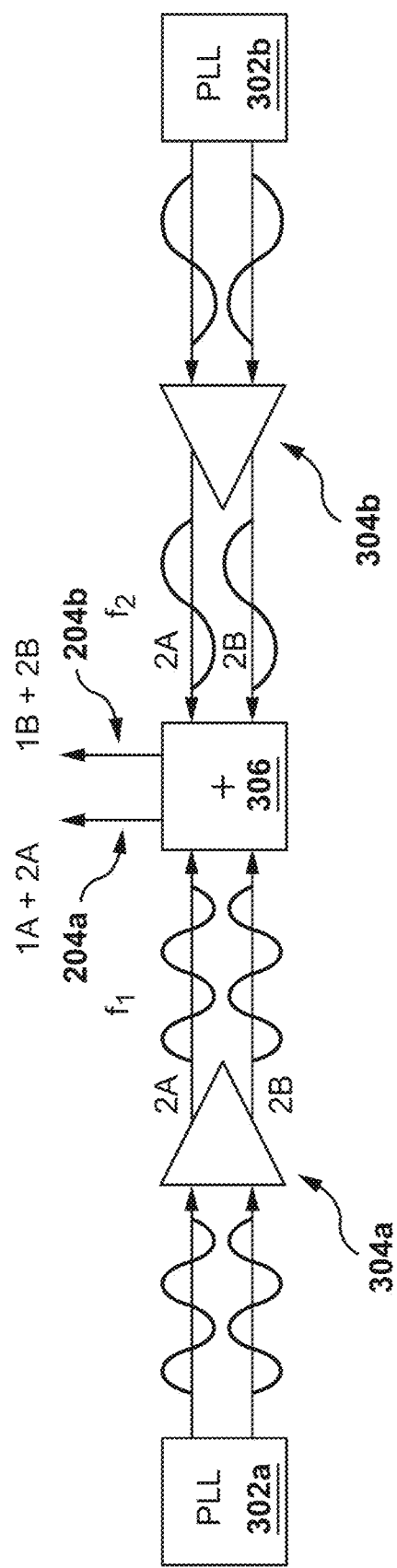
FIG. 3 depicts more detailed view of clock multiple unit (CMU), in accordance with various embodiments of present disclosure.

FIG. 3 depicts more detailed view of CMU 202, in accordance with various embodiments of present disclosure. As shown in FIG. 3, CMU 202 may include a PLL 302a and a PLL 302b, a driver 304a, a driver 304b, and a summer 306. It will be understood that other elements may be present, but are not illustrated for the purpose of tractability and simplicity.

As shown in FIG. 3, PLL 302a and PLL 302b may generate a first high-speed clock frequency $f_1$ and a second high-speed clock frequency $f_2$. Further, driver 304a may be configured to convert the first high-speed clock frequency $f_1$ into differential mode and may supply in-phase component 1A and out of phase component 1B associated with the first differential mode encoded high-speed clock frequency $f_1$. Also, driver 304b may be configured to convert the second high-speed clock frequency $f_2$ into common mode and may supply the common mode components 2A and 2B associated with second high-speed clock frequency.

In certain embodiments, common mode components 2A and 2B may have the same signal attributes, such as, for example, amplitude, phase and frequency etc. Also, in certain embodiments of present disclosure PLL 302a and PLL 302b may be capable of generating high-speed clock frequencies in differential mode or common mode.

With this said, summer 306 may receive an in-phase component 1A, out of phase component 1B, common mode components 2A and 2B, as supplied by drivers 304a and driver 304b. Further, summer 306 may be configured to combine the in-phase component 1A with common mode components 2A and out of phase component 1B with common mode component 2B and transmit the combined component 1A+2A, represented as V(P), and 1B+2B, represented as V(M), on wires 204a and 204b respectively. In certain embodiments, common mode component 2A may be the same as common mode component 2B.

As such, CMU 202 may simultaneously transmit two high-speed clock frequencies to a group of SerDess 206 using only two wires. One of the high-speed clock frequencies may be transmitted in a differential mode while the other high-speed clock frequency may be transmitted in common mode. Since two wires 204a and 204b transmit the combination of differential modes and common modes of the two high-speed clock frequencies, the two wires 204a and 204b are not susceptible to parasitic coupling. Therefore, such a configuration mitigates the need for any extra shielding or isolation to be provided between two wires 204a and 204b. Thus, the implementation of the disclosed two-wire Macro 200 effectively and efficiently operates within the available spatial area and power limitations of the ICs.

Figure 4:
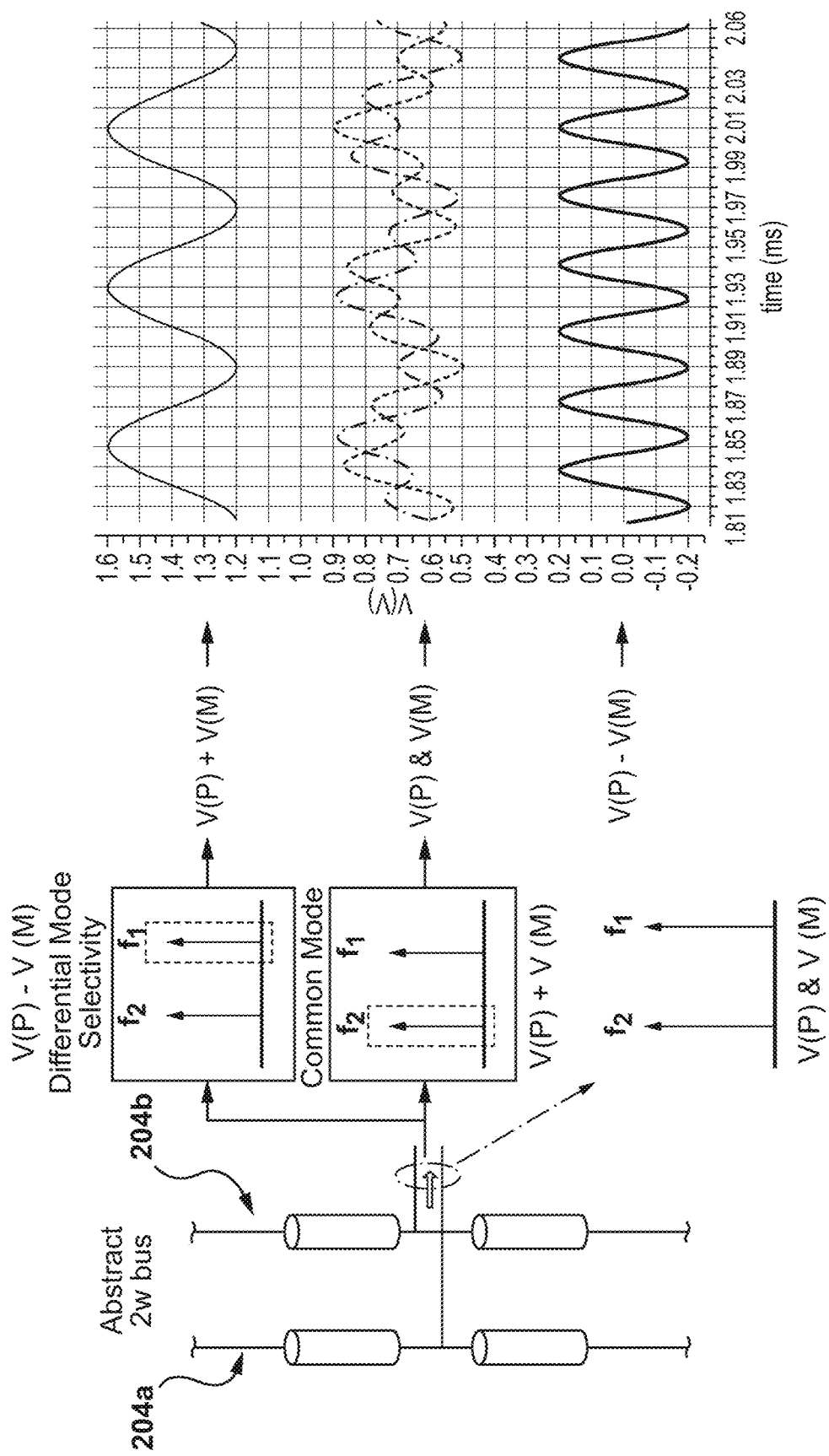
FIG. 4 illustrates a time domain representation of high-speed clock frequencies propagating through two wires, in accordance with various embodiments of present disclosure.

FIG. 4 illustrates a time domain representation of high-speed clock frequencies propagating through two wires, in accordance with various embodiments of present disclosure. As shown in FIG. 4, V(P) & V(M) depicts a combination of the first high-speed clock frequency $f_1$ and second high-speed clock frequency $f_2$, as these frequencies appears on each of the wires 204a and 204b when viewed individually.

Further, the first high-speed clock frequency $f_1$ may be extracted from V(P) & V(M) by computing the difference between the voltages on the two wires 204a and 204b. Given that the first high-speed clock frequency $f_1$ was initially encoded in differential mode, the first high-speed clock frequency $f_1$ may be represented as V(P)–V(M). In a similar manner, the second high-speed clock frequency $f_2$ may be extracted from V(P) & V(M) by adding the voltages on two wires 204a and 204b. Since, the second high-speed clock frequency $f_2$ was initially encoded in common mode, the second high-speed clock frequency $f_2$ may be represented as V(P)+V(M).

Figure 5A:
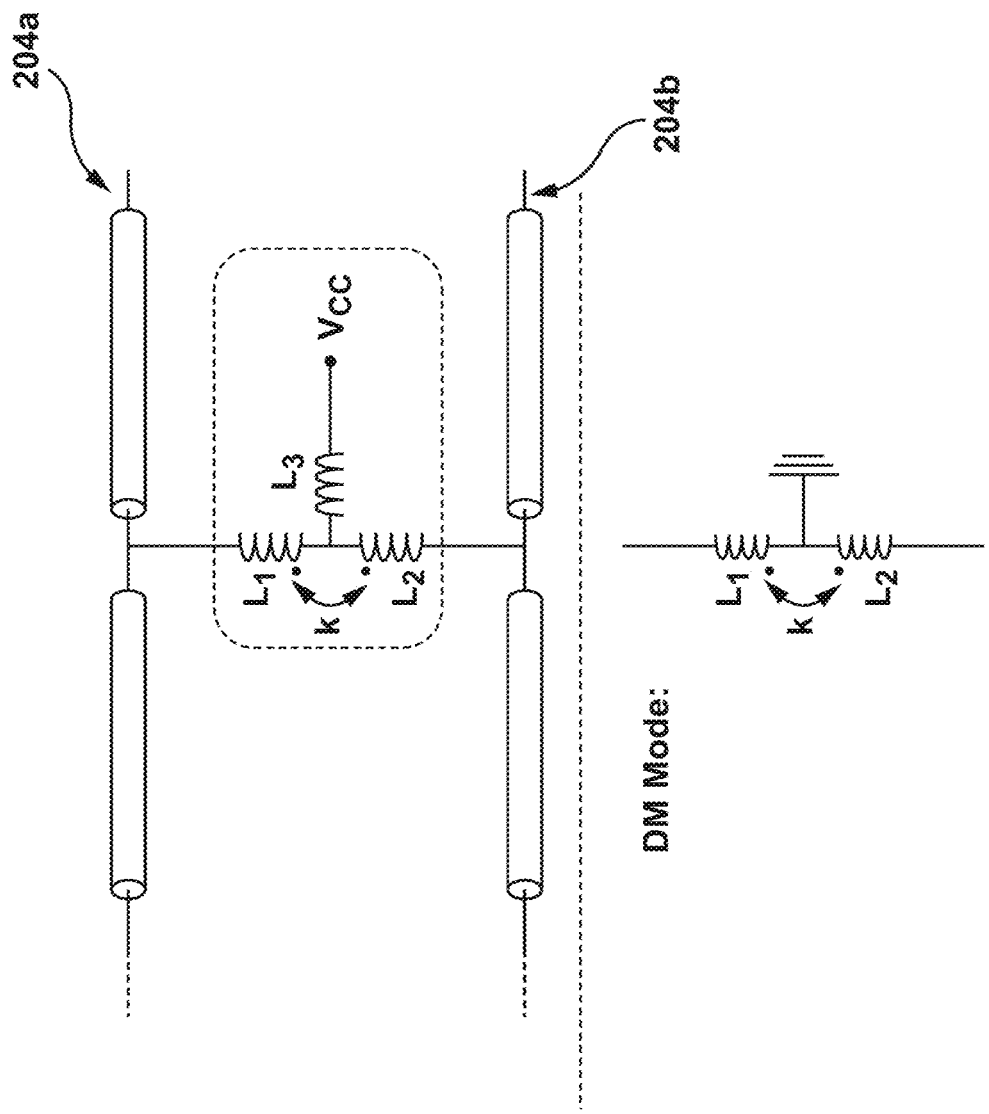
FIGS. 5A and 5B depicts implementation of a resonant bus topology between two wires, in accordance with various embodiments of present disclosure.
Figure 5B:
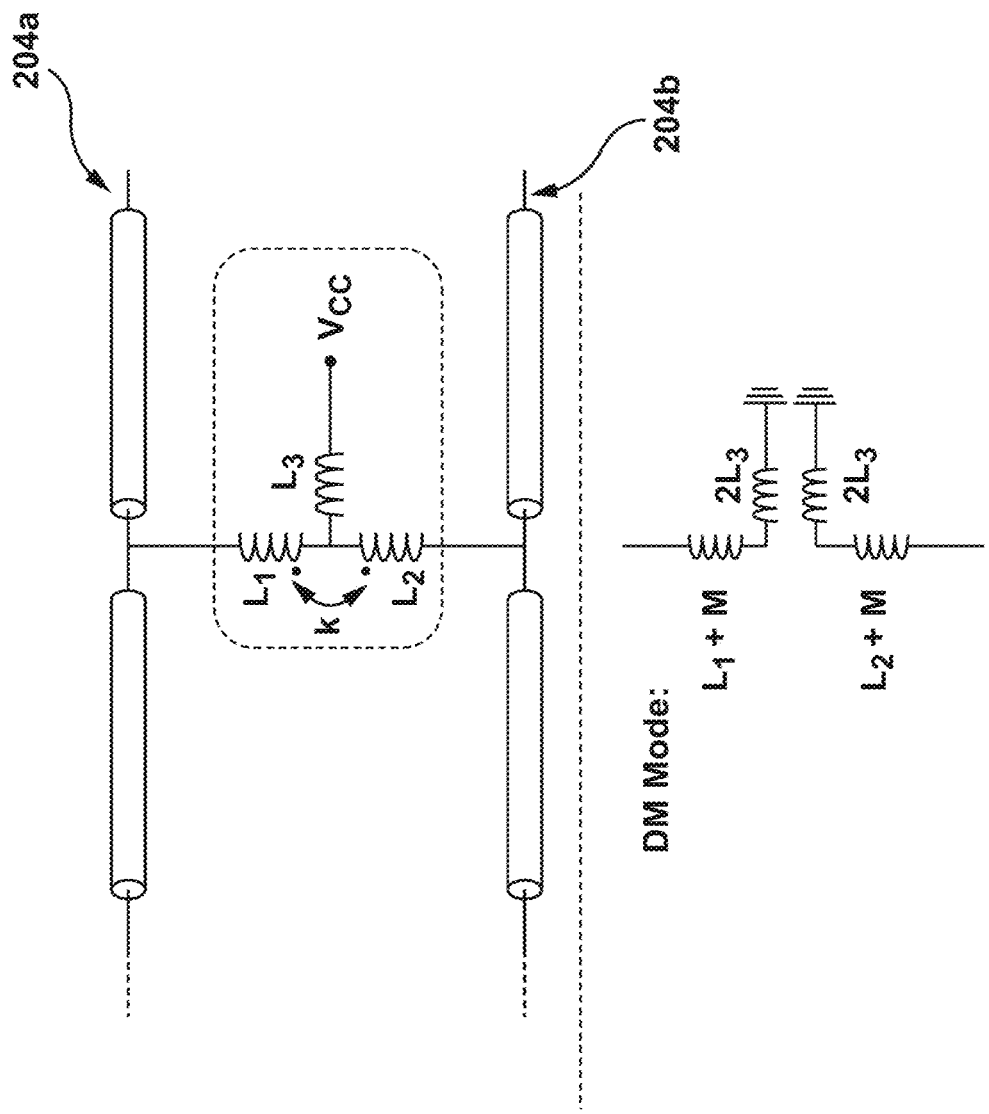

FIGS. 5A and 5B depict the implementation of a resonant bus topology between two wires 204a and 204b, in accordance with various embodiments of present disclosure. As shown, the resonant bus topology between the two wires 204a and 204b may further employ three inductors $L_1$, $L_2$, and $L_3$ connected in a star configuration network, in order to assist the propagation of differential mode and common mode through two wires 204a and 204b. However, it will be understood that any suitable circuitry and configuration may be employed without departing from the principles presented herein.

FIG. 5A, illustrates operation of resonant bus topology between two wires 204a and 204b for propagation of differential mode and FIG. 5B illustrates operation of resonant bus topology between two wires 204a and 204b for propagation of common mode, in accordance with various embodiments of present disclosure. As shown, inductors $L_1$ and $L_2$ may assist in propagation of differential mode and inductors $L_1$, $L_2$, and $L_3$ may assist in propagation of common mode.

It will be appreciated that utilizing two wires for propagation of two high-speed clock frequencies instead of four wire structure reduces the requirement of physical resources. Further, sharing of physical resources, such as, for example, inductors for propagation of two high-speed clock frequencies $f_1$ and $f_2$ in differential mode and common mode between two wires 204a and 204b contributes in efficient utilization of available area and power.

Figure 6:
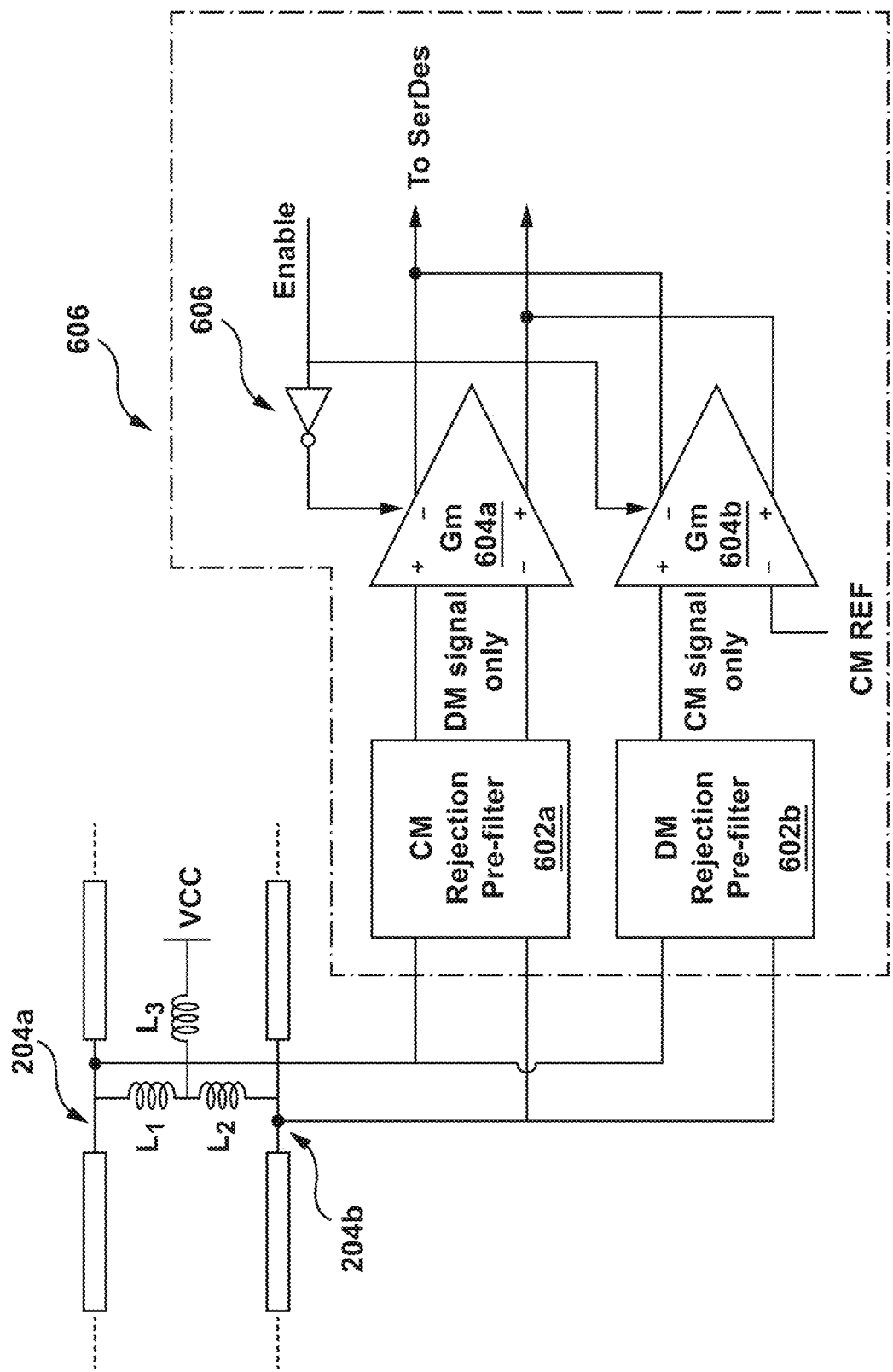
FIG. 6 illustrates a high-level functional block diagram of a clock recovery module, in accordance with various embodiments of present disclosure.

Returning to FIG. 2, a group of SerDess 206 may receive the high-speed clock frequencies encoded in differential mode and common mode. To this end, FIG. 6 illustrates a high-level functional block diagram of a clock recovery module 600 configured to extract two high-speed clock frequencies $f_1$ and $f_2$, in accordance with various embodiments of present disclosure. In certain embodiments, clock recovery module 600 may be integrated with each of the SerDes in group of SerDes 206.

As shown in FIG. 6, clock recovery module 600 may employ a common mode rejection pre-filter 602a, a differential mode rejection pre-filter 602b, a differential mode amplifier 604a, a common mode amplifier 604b and an amplifier enabler 606. It will be understood that other elements may be present, but are not illustrated for the purpose of tractability and simplicity.

Clock recovery module 600 may operate to implement arithmetic operations such as, for example, addition, subtraction, to extract differential mode encoded high-speed clock frequency $f_1$ and common mode encoded high speed clock frequency $f_2$ may perform amplitude amplification on extracted clock frequencies.

Moreover, common mode rejection pre-filter 602a may be configured to operate in combination with the differential mode and common mode encoded two high-speed clock frequencies and extracts differential mode encoded high-speed clock frequency $f_1$ and suppress common mode encoded high-speed clock frequency $f_2$ by performing a subtraction operation. To this end, FIG. 7A represents an exemplary circuit for common mode rejection pre-filter 602a, which is configured to suppress the common mode encoded high-speed clock frequency $f_2$ and extracts differential mode encoded high-speed clock frequency $f_1$, in accordance with various embodiments of present disclosure.

Figure 7A:
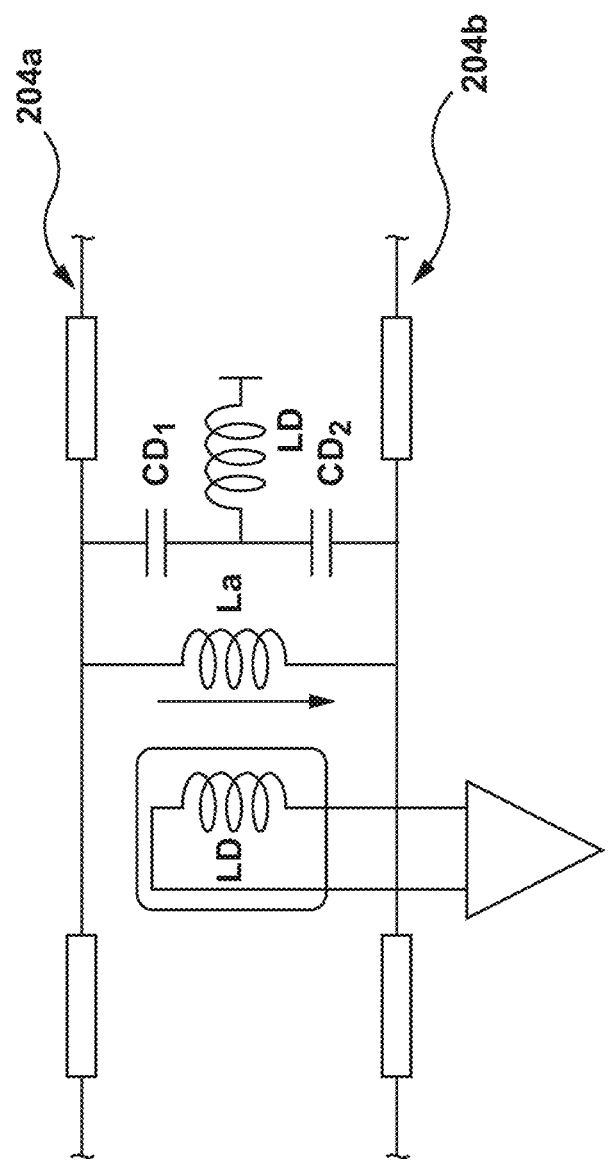
FIG. 7A represents an exemplary circuit for common mode rejection pre-filter, in accordance with various embodiments of present disclosure.

As shown in FIG. 7A, inductor $L_a$ may be connected differentially in between two wires 204a and 204b and assist in sensing differential mode encoded high-speed clock frequency $f_1$. In this configuration, a current may flow through the inductor $L_a$ due to potential difference between two wires 204a and 204b whereas, there is no flow of current from common mode encoded high-speed clock frequency $f_2$. Further, inductor $L_a$ may be magnetically coupled with inductor $L_b$ in order to induce a representation of differential mode encoded high-speed clock frequency onto the following differential mode amplifier 604a.

Returning back to FIG. 6, common mode rejection pre-filter 602a may also supply the extracted differential mode encoded high-speed clock frequency $f_1$ to differential mode amplifier 604a. Differential mode amplifier 604a may be configured to amplify the amplitude and supply amplified differential mode encoded high-speed clock frequency $f_1$ to one or more SerDes in group of SerDes 206.

Similarly, differential mode rejection pre-filter 602b may be configured to operate on combination of differential mode and common mode encoded two high-speed clock frequencies and extracts common mode encoded high-speed clock frequency $f_2$ and suppress differential mode encoded high-speed clock frequency $f_1$ by performing an addition operation. To this end, FIG. 7B represents an exemplary circuit for differential mode rejection pre-filter 602b, configured to suppress differential mode encoded high-speed clock frequency $f_1$ and extracts common mode encoded high-speed clock frequency $f_2$, in accordance with various embodiments of present disclosure.

Figure 7B:
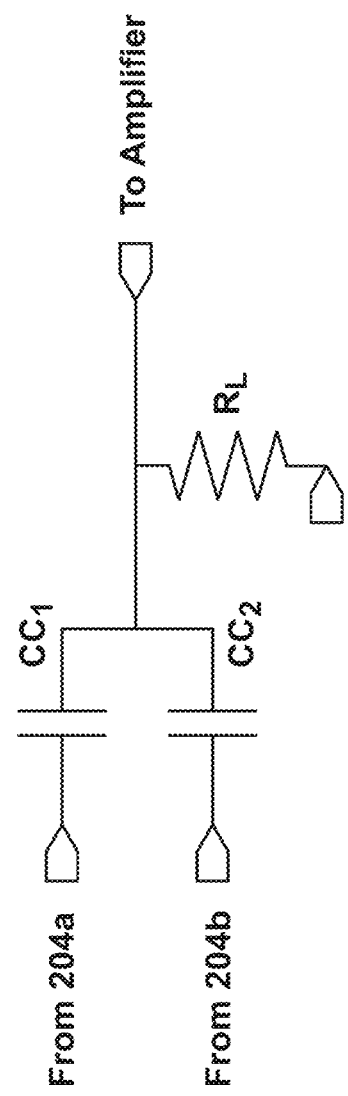
FIG. 7B represents an exemplary circuit for differential mode rejection pre-filter, in accordance with various embodiments of present disclosure.

As shown in FIG. 7B, a capacitor $C_{c1}$ may be connected to wire 204a and capacitor $C_{c2}$ may be connected to wire 204b. With this arrangement, capacitor $C_{c1}$ and capacitor $C_{c2}$ performs addition operation and thus blocks differential mode encoded high-speed clock frequency $f_1$ and common mode encoded high-speed clock frequency $f_2$ appears across resistor $R_c$. Also, voltage across resistor $R_c$ may be supplied to the following common mode amplifier 604b.

Returning to FIG. 6, differential mode rejection pre-filter 602b may then supply the extracted common mode encoded high-speed clock frequency $f_2$ to common mode amplifier 604b. Common mode amplifier 604b may be configured to amplify the amplitude and supply amplified common mode encoded high-speed clock frequency $f_2$ to one or more SerDes in group of SerDes 206. Certain SerDes in group of SerDes 206 may preferably operate on differential mode encoded high-speed clock frequency, to this end, in certain embodiments, amplified common mode encoded high-speed clock frequency $f_2$ may be converted to differential mode encoded high-speed clock frequency $f_2$ before supplying to one or more SerDes in group of SerDes 206.

It will be understood that FIGS. 7A and 7B merely illustrates exemplary circuits corresponding to common mode rejection pre-filter 602a and differential mode rejection pre-filter 602b. However, any suitable circuitry and configuration may be employed without departing from the principles presented herein. For example, in certain embodiments a single circuit configuration may be provided for the differential mode encoded high-speed clock frequency $f_1$ and common mode encoded high-speed clock frequency $f_2$ to differential mode amplifier 604a, a common mode amplifier 604b respectively.

It will be appreciated that common mode rejection pre-filter 602a and differential mode rejection pre-filter 602b may select a high-speed clock frequency based either on differential mode encoding or common mode encoding of high-speed clock frequency rather than selecting a clock based on frequency selection or other similar characteristics. Also, mode based clock frequency selection may assist in selecting between two high-speed clock frequencies more efficiently, even if the two high-speed clock frequencies are close to each other, Thereby, clock recovery module 600 may provide an easy and efficient implementation of related hardware.

Further, amplifier enabler 606 may be configured to control the operation of differential mode amplifier 604a, common mode amplifier 604b in accordance with clock frequency requirement by one or more SerDes in group of SerDes 206. In so doing, amplifier enabler 606 may enable one amplifier for operation while disabling the functionality of other amplifier. To this end, clock recovery module 600 may allow only one clock frequency to propagate into one or more SerDess in the group of SerDess 206.

Figure 8:
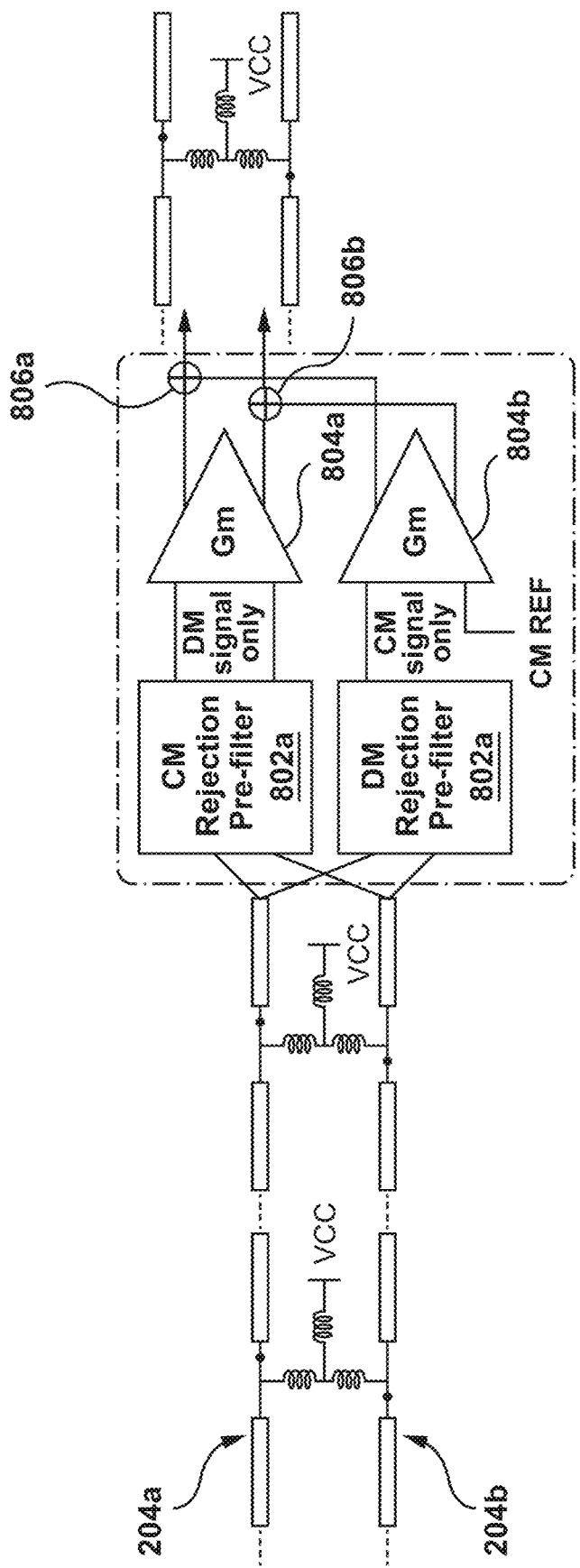
FIG. 8 depicts a high-level functional block diagram of clock amplification module, in accordance with various embodiments of present disclosure.

In certain embodiments, the group of SerDess 206 may have a large number of SerDess members. As such, two wire-based Macro 200 may require the re-amplification of the first high-speed clock frequency $f_1$ and second high-speed clock frequency $f_2$ for continuous propagation to all SerDess members in the group of SerDes 206. Accordingly, FIG. 8 depicts a high-level functional block diagram of clock amplification module 800, implemented between two wires 204a and 204b and may be configured to amplify the high-speed clock frequencies, in accordance with various embodiments of present disclosure. As shown, clock amplification module 800 may employ a common mode rejection pre-filter 802a, a differential mode rejection pre-filter 802b, a differential mode amplifier 804a, a common mode amplifier 804b and summers 806a and 806b. It will be understood that other elements may be present, but are not illustrated for the purpose of tractability and simplicity.

It will be understood that common mode rejection pre-filter 802a, and differential mode rejection pre-filter 802b may operate in a similar manner as common mode rejection pre-filter 602a, a differential mode rejection pre-filter 602b. That is, common mode rejection pre-filter 802a may be configured to operate on combination of differential mode and common mode encoded two high-speed clock frequencies and extracts differential mode encoded high-speed clock frequency $f_1$ and suppress common mode encoded high-speed clock frequency $f_2$ by performing a subtraction operation and may supply the extracted differential mode encoded high-speed clock frequency $f_1$ to the following differential mode amplifier 804a.

Similarly, differential mode rejection pre-filter 802b may be configured to operate on combination of differential mode and common mode encoded two high-speed clock frequencies and extracts common mode encoded high-speed clock frequency $f_2$ and suppress differential mode encoded high-speed clock frequency $f_1$ by performing an addition operation and may supply the extracted common mode encoded high-speed clock frequency $f_2$ to the following differential mode amplifier 804b.

It will be appreciated that clock amplification module 800 both for the differential mode amplifier 804a, and common mode amplifier 804b, may be operated simultaneously to individually amplify extracted differential mode encoded high-speed clock frequency $f_1$ and extracted common mode encoded high-speed clock frequency $f_2$ respectively.

Because the purpose of clock amplification module 800 is to assist in efficient propagation of high-speed clock frequencies, the amplified clock frequencies $f_1$ and $f_2$ may be added together summers 806a and 806b before transmitting back to two wires 204a and 204b. In this manner, summer 806a is able to combine the in-phase component associated with the first differential mode encoded high-speed clock frequency $f_1$ with the common mode component associated with the second common mode encoded high-speed clock frequency $f_2$. Summer 806b then combines the out of phase component associated with first differential mode encoded high-speed clock frequency $f_1$ with common mode component associated with second common mode encoded high-speed clock frequency $f_2$.

Figure 9:
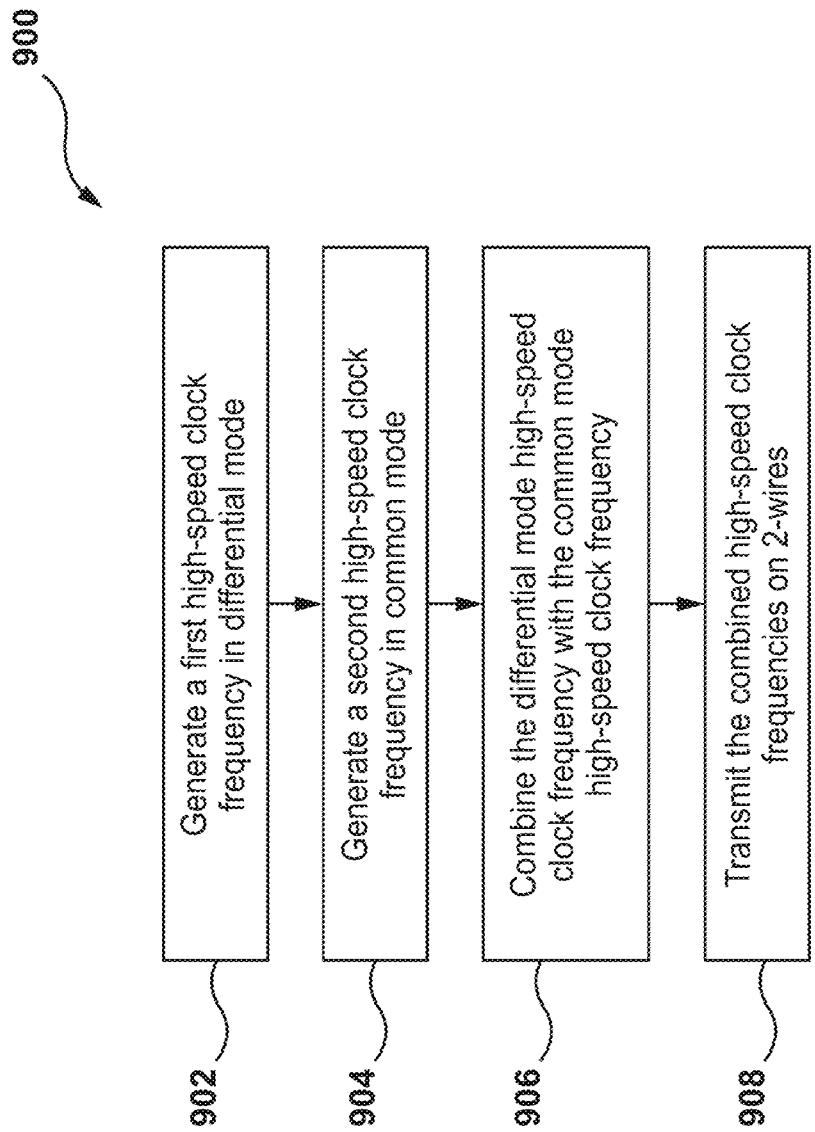
FIG. 9 depicts a functional flow diagram of process directed to multi-rate high-speed clock frequencies generation and processing, in accordance with various embodiments of the present disclosure.

FIG. 9 depicts a functional flow diagram of process 900 directed to multi-rate high-speed clock frequencies generation and processing, in accordance with various embodiments of the present disclosure.

Process 900 commences at task block 902, where CMU 202 operate to generate a first high-speed clock frequency in differential mode. As noted above, PLL 302A in conjunction with driver 304A generates a first high-speed clock frequency $f_1$ and convert the first high-speed clock frequency $f_1$ into differential mode. Such that, the output of driver 304A is in-phase and out of phase components associated with the first differential mode encoded high-speed clock frequency $f_1$.

At task block 904, CMU 202 operates to generate a second high-speed clock frequency in common mode. As noted above, PLL 302B in conjunction with driver 304B generates a second high-speed clock frequency $f_2$ and convert the second high-speed clock frequency $f_2$ into common mode. Such that, the output of driver 304B are common mode components of associated with the second common mode encoded high-speed clock frequency $f_2$.

Process 900 proceeds to task block 906, where CMU 202 operate to combine differential mode encoded high-speed clock frequency $f_1$ and common mode encoded high-speed clock frequency $f_2$. As previously discussed, summer 306 is configured to combine the first differential mode encoded high-speed clock frequency $f_1$ and the second common mode encoded high-speed clock frequency $f_2$. To this end, summer 306 may be configured to combine the in-phase component associated with the first differential mode encoded high-speed clock frequency $f_1$ with common mode components associated with the second common mode encoded high-speed clock frequency $f_2$ and out of phase component associated with the first differential mode encoded high-speed clock frequency $f_1$ with common mode component associated with the second common mode encoded high-speed clock frequency $f_2$.

Finally, at task block 908, CMU 202 simultaneously transmits the combined high-speed clock frequencies on two wires. As discussed above, summer 306 simultaneously transmits the combined high-speed clock frequencies on two wires 204A and 204B.

Figure 10:
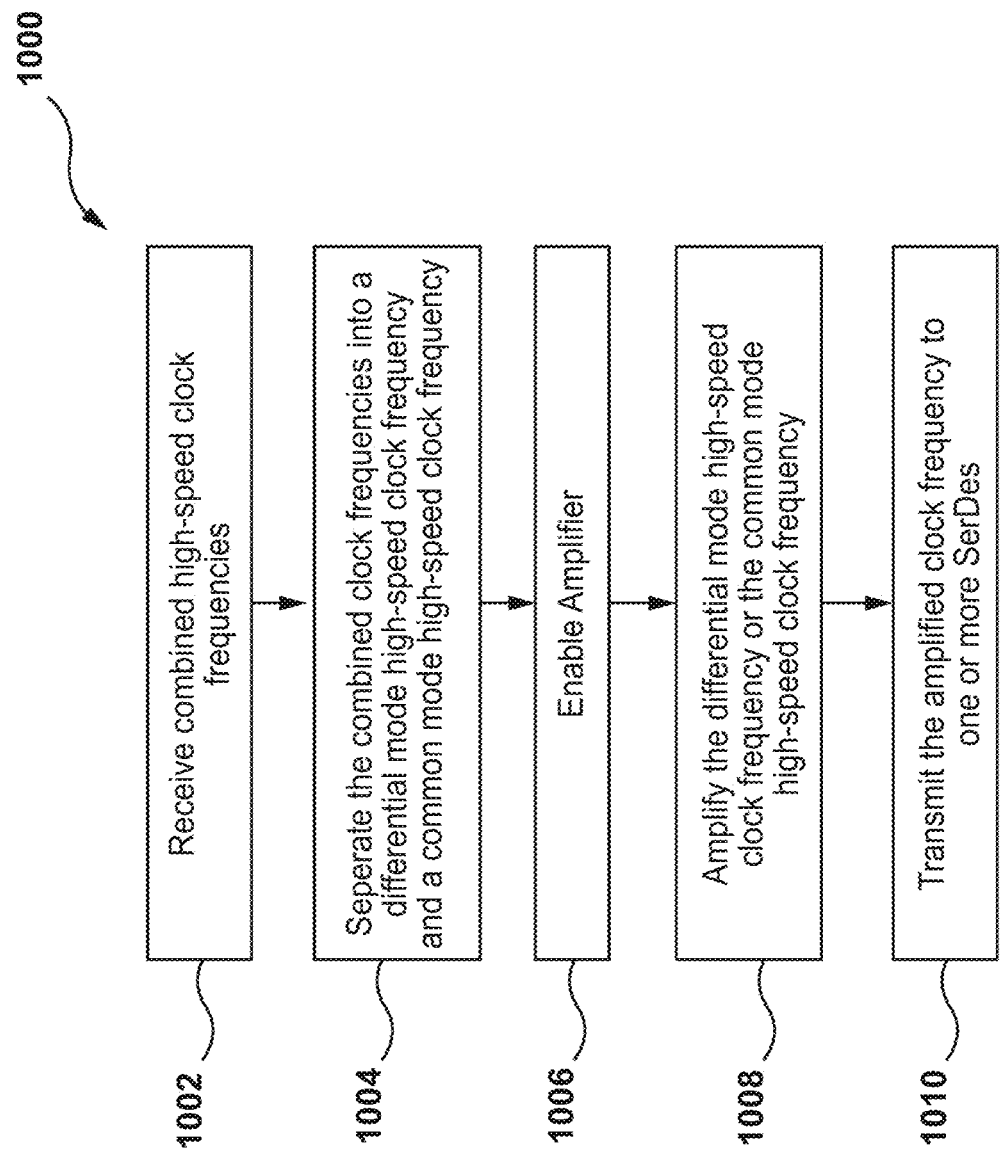
FIG. 10 depicts a functional flow diagram of process 1000 directed to multi-rate high-speed clock frequencies recovery processing, in accordance with various embodiments of the present disclosure.

FIG. 10 depicts a functional flow diagram of process 1000 directed to multi-rate high-speed clock frequencies recovery processing, in accordance with various embodiments of the present disclosure.

Process 1000 commences at task block 1002, where clock recovery module 600 receive a combined high-speed clock frequencies. As discussed above, common mode rejection pre-filter 602a and differential mode rejection pre-filter 602b receives combined combination of differential mode and common mode encoded two high-speed clock frequencies.

At task block 1004, clock recovery module 600 operates to separate the combined high-speed clock frequencies into a differential mode high-speed clock frequency and a common mode high-speed clock frequency. As noted above, common mode rejection pre-filter 602a operate to extract differential mode high-speed clock frequency $f_1$ and suppress common mode encoded high-speed clock frequency $f_2$ by performing a subtraction operation. Also, differential mode rejection pre-filter 602b operate to extract common mode high-speed clock frequency $f_2$ and suppress differential mode encoded high-speed clock frequency $f_1$ by performing an addition operation.

Process 1000 proceeds to task block 1006, where clock recovery module 600 enable an amplifier in accordance with amplification of differential mode high-speed clock frequency $f_1$ or common mode high-speed clock frequency $f_2$. As discussed above, amplifier enabler 606 may be configured to enable either differential mode amplifier 604a, or common mode amplifier 604b.

Process 1000 advances to task block 1008, where clock recovery module 600 amplify the differential mode high-speed clock frequency or the common mode high-speed clock frequency. As previously discussed, based on enablement differential mode amplifier 604a may amplify differential mode high-speed clock frequency $f_1$ and common mode amplifier 604b may amplify common mode high-speed clock frequency $f_2$.

Finally at task 1010, clock recovery module 600 transmits the amplified high-speed clock frequency to one or more SerDess. As discussed earlier, based on enablement differential mode amplifier 604a may transmit the amplified differential mode high-speed clock frequency $f_1$ to one or more SerDes in group of SerDes 206 and common mode amplifier 604b may transmit the amplified common mode high-speed clock frequency $f_2$ to one or more SerDes in group of SerDes 206.

Figure 11:
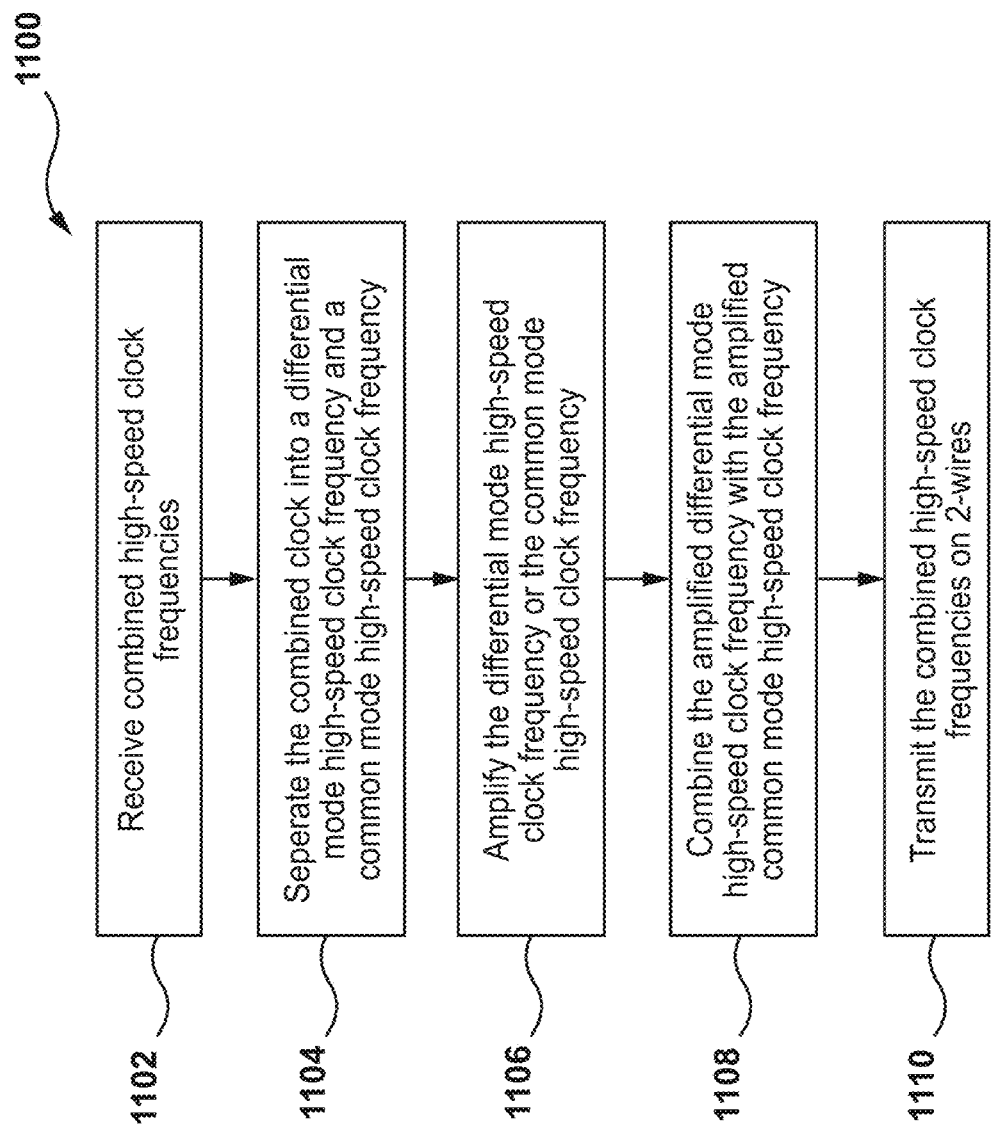
FIG. 11 depicts a functional flow diagram of process 1100 directed to effective propagation of multi-rate high-speed clock frequencies in two wires, in accordance with various embodiments of the present disclosure.
Figure 3:
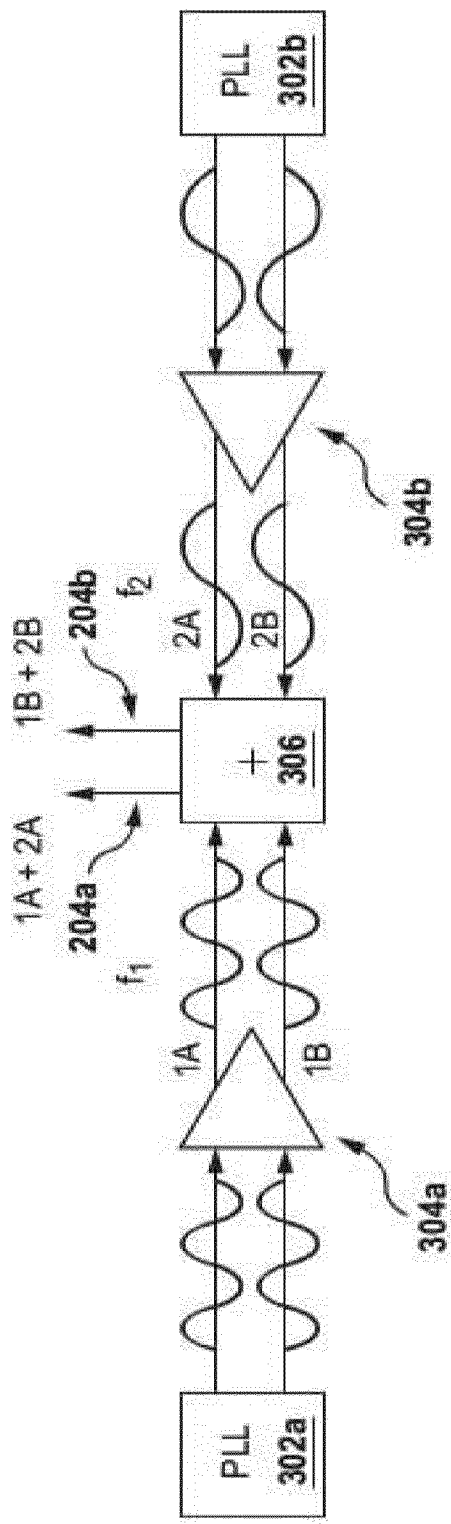
Figure 6:
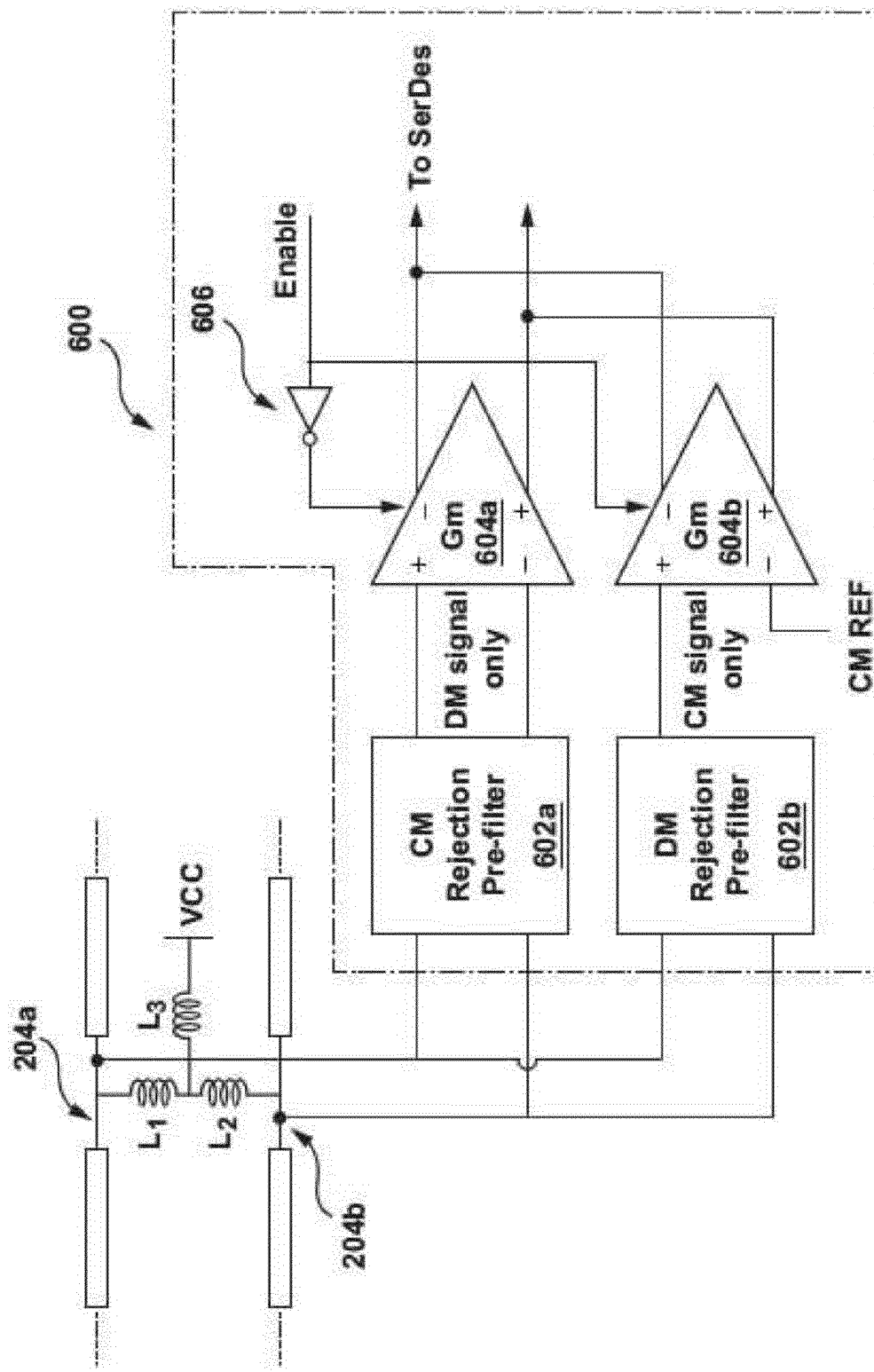

FIG. 11 depicts a functional flow diagram of process 1100 directed to the effective propagation of multi-rate high-speed clock frequencies in two wires, in accordance with various embodiments of the present disclosure.

Process 1100 commences at task block 1102, where clock amplification module 800 receive a combined high-speed clock frequencies. As discussed above, common mode rejection pre-filter 802a and differential mode rejection pre-filter 802b receives combined combination of differential mode and common mode encoded two high-speed clock frequencies At task block 1104, clock amplification module 800 operates to separate the combined high-speed clock frequencies into a differential mode high-speed clock frequency and a common mode high-speed clock frequency. As noted above, common mode rejection pre-filter 802a operate to extract differential mode high-speed clock frequency $f_1$ and suppress common mode encoded high-speed clock frequency $f_2$ by performing a subtraction operation. Also, differential mode rejection pre-filter 802b operate to extract common mode high-speed clock frequency $f_2$ and suppress differential mode encoded high-speed clock frequency $f_1$ by performing an addition operation.

Process 1100 advances to task block 1108, where clock amplification module 800 amplify the differential mode high-speed clock frequency and the common mode high-speed clock frequency. As previously discussed, differential mode amplifier 604a may amplify differential mode high-speed clock frequency $f_1$ and common mode amplifier 604b may amplify common mode high-speed clock frequency $f_2$.

Process 1100 proceeds to task block 1108, where clock amplification module 800 operate to combine amplified differential mode encoded high-speed clock frequency $f_1$ and amplified common mode encoded high-speed clock frequency $f_2$. As previously discussed, summers 806a and 806b are configured to combine the first differential mode encoded high-speed clock frequency $f_1$ and the second common mode encoded high-speed clock frequency $f_2$.

Therefore, summer 806a may be configured to combine the in-phase differential component associated with the first differential mode encoded high-speed clock frequency $f_1$ with common mode components of associated with the second common mode encoded high-speed clock frequency $f_2$ and summer 806b may be configured to combine out of phase component associated with the first differential mode encoded high-speed clock frequency $f_1$ with common mode component of associated with the second common mode encoded high-speed clock frequency $f_2$.

Finally at task 1110, clock amplification module 800 simultaneously transmits the combined high-speed clock frequencies on two wires. As discussed above, summers 806a and 806b transmits the combined high-speed clock frequencies on two wires 204A and 204B respectively.

Thus, by virtue of techniques provided by two wire-based Macro, efficient utilization of available area and power may be achieved, such that efficiency of designing ICs incorporating CMUs and multiple SerDes may be increased through the use of efficient components and design.

It is to be understood that the operations and functionality of the described two wire-based Macro, constituent components, and associated processes may be achieved by any one or more of hardware-based, software-based, and firmware-based elements. Such operational alternatives do not, in any way, limit the scope of the present disclosure.

It will also be understood that, although the embodiments presented herein have been described with reference to specific features and structures, it is clear that various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. A two wire-based clock multiplication unit (CMU) comprising:
   a first phase lock loop (PLL) configured to generate a first high-speed clock frequency $f_1$ encoded in differential mode;
   a second PLL configured to generate a second high-speed clock frequency $f_2$ encoded in common mode; and
   a summer configured to combine the differential mode encoding the first high-speed clock frequency $f_1$ and the common mode encoding the second high-speed clock frequency $f_2$ and simultaneously transmit the combined differential and common mode high-speed clock frequencies on a two wire-based conductor bus.

2. The two wire-based CMU of claim 1, further comprising a first driver and a second driver.

3. The two wire-based CMU of claim 2, wherein the first driver outputs an in-phase component and an out of phase component associated with the first differential mode encoded high-speed clock frequency $f_1$.

4. The two wire-based CMU of claim 3, wherein the second driver outputs a common mode component associated with the second common mode encoded high-speed clock frequency $f_2$.

5. The two wire-based CMU of claim 4, wherein the summer combines the in-phase component associated with the first differential mode encoded high-speed clock frequency $f_1$ and common mode component associated with the second common mode encoded high-speed clock frequency $f_2$ and outputs a first combined component.

6. The two wire-based CMU of claim 5, wherein the summer transmits the first combined component on a first wire of the two wire-based conductor bus.

7. The two wire-based CMU of claim 4, wherein the summer combines the out of phase component associated with the first differential mode encoded high-speed clock frequency $f_1$ and common mode component associated with the second common mode encoded high-speed clock frequency $f_2$ and outputs a second combined component.

8. The two wire-based CMU of claim 7, wherein the summer transmits the second combined component on a second wire of the two wire-based conductor bus.

9. A two wire-based clock recovery module comprising:
a common mode rejection pre-filter configured to receive a first combined component from a first wire of a two wire-based conductor bus and receive a second combined component from a second wire of the two wire-based conductor bus, wherein:
the first combined component contains an in-phase component associated with a first high-speed clock frequency $f_1$ encoded in a differential mode and a common mode component associated with a second high-speed clock frequency $f_2$ encoded in a common mode,
the second combined component contains an out of phase component associated with the first differential mode encoded high-speed clock frequency $f_1$ and the common mode component associated with the second common mode encoded high-speed clock frequency $f_2$,
the common mode rejection pre-filter configured to suppress the common mode components in the first and second combined component associated with the second common mode encoded high-speed clock frequency $f_2$ and outputs the differential mode components associated with the first differential mode encoded high-speed clock frequency $f_1$;
a differential mode rejection pre-filter configured to receive the first combined component and the second combined component, in which the differential mode rejection pre-filter is configured to suppress the in-phase and out of phase components in the first and second combined component associated with the first differential mode encoded high-speed clock frequency $f_1$ and outputs the common mode component associated with the second common mode encoded high-speed clock frequency $f_2$;
a differential amplifier configured to amplify the differential mode components associated with the first differential mode encoded high-speed clock frequency $f_1$ and outputs an amplified in-phase and out of phase component associated with the first differential mode encoded high-speed clock frequency $f_1$;
a common mode amplifier configured to amplify the common mode component associated with the second common mode encoded high-speed clock frequency $f_2$; and
an amplifier enabler unit configured to select either the differential amplifier or the common mode amplifier to perform the amplification operation.

10. The two wire-based clock recovery module of claim 9, wherein the common mode component associated with the second common mode encoded high-speed clock frequency $f_2$ is converted to an amplified differential mode component.

11. The two wire-based clock recovery module of claim 9 provides either the amplified differential mode components associated with the first differential mode encoded high-speed clock frequency $f_1$ or the differential mode component associated with the second common mode encoded high-speed clock frequency $f_2$ to a plurality of transceivers.

12. A two wire-based clock amplification module comprising:
a common mode rejection pre-filter configured to receive a first combined component from a first wire of a two wire-based conductor bus and receive a second combined component from a second wire of the two wire-based conductor bus, wherein:
the first combined component contains an in-phase component associated with a first high-speed clock frequency $f_1$ encoded in a differential mode and a common mode component associated with a second high-speed clock frequency $f_2$ encoded in a common mode,
the second combined component contains an out of phase component associated with the first differential mode encoded high-speed clock frequency $f_1$ and the common mode component associated with the second common mode encoded high-speed clock frequency $f_2$, and
the common mode rejection pre-filter configured to suppress the common mode components in the first and second combined component associated with the second common mode encoded high-speed clock frequency $f_2$ and outputs the differential mode components associated with the first differential mode encoded high-speed clock frequency $f_1$;
a differential mode rejection pre-filter configured to receive the first combined component and the second combined component, in which the differential mode rejection pre-filter is configured to suppress the in-phase and out of phase components in the first and second combined component associated with the first differential mode encoded high-speed clock frequency $f_1$ and outputs the common mode components associated with the second common mode encoded high-speed clock frequency $f_2$;
a differential amplifier configured to amplify the differential mode component associated with the first differential mode encoded high-speed clock frequency $f_1$ and outputs an amplified in-phase and out of phase component associated with the first differential mode encoded high-speed clock frequency $f_1$;
a common mode amplifier configured to amplify the common mode component associated with the second common mode encoded high-speed clock frequency $f_2$;
a first summer configured to combine the amplified in-phase component associated with the first differential mode encoded high-speed clock frequency $f_1$ with the amplified common mode component associated with the second common mode encoded high-speed clock frequency $f_2$ and outputs a first amplified combined component; and
a second summer configured to combine the amplified out of phase component associated with the first differential mode encoded high-speed clock frequency $f_1$ with the amplified common mode component associated with the second common mode encoded high-speed clock frequency $f_2$ and outputs a second amplified combined component.

13. The two wire-based clock amplification module of claim 12, wherein the first summer transmits the first amplified combined component on the first wire of the two wire-based conductor bus.

14. The two wire-based clock amplification module of claim 12, wherein the second summer transmits the second amplified combined component on the second wire of the two wire-based conductor bus.

15. A two wire-based clock multiplication unit (CMU) based method of generating and transmitting high-speed clock frequencies comprising:
generating a first high-speed clock frequency $f_1$ encoded in differential mode;
generating a second high-speed clock frequency $f_2$ encoded in common mode;
combining the differential mode encoded first high-speed clock frequency $f_1$ and common mode encoded second high-speed clock frequency $f_2$;
transmitting the combined high-speed clock frequencies on a two wire-based conductor bus.

16. The method of claim 15, wherein an in-phase component and an out of phase component associated with the first differential mode encoded high-speed clock frequency $f_1$ is computed.

17. The method of claim 16, wherein a common mode component associated with the second common mode encoded high-speed clock frequency $f_2$ is computed.

18. The method of claim 17, wherein the in-phase component associated with the first differential mode encoded high-speed clock frequency $f_1$ and common mode component associated with the second common mode encoded high-speed clock frequency $f_2$ are combined, resulting in a first combined component.

19. The method of claim 18, wherein the first combined component is transmitted on a first wire of the two wire-based conductor bus.

20. The method of claim 18, wherein the out of phase component associated with the first differential mode encoded high-speed clock frequency $f_1$ and common mode component associated with the second common mode encoded high-speed clock frequency $f_2$ are combined, resulting in a second combined component.

21. The method of claim 20, wherein the second combined component is transmitted on a second wire of the two wire-based conductor bus.

22. A two wire-based method of clock recovery comprising:
receiving a first combined component from a first wire of a two wire-based conductor bus and receiving a second combined component from a second wire of the two wire-based conductor bus, wherein:
the first combined component contains an in-phase component associated with a first high-speed clock frequency $f_1$ encoded in a differential mode and a common mode component associated with a second high-speed clock frequency $f_2$ encoded in a common mode,
the second combined component contains an out of phase component associated with the first differential mode encoded high-speed clock frequency $f_1$ and the common mode component associated with the second common mode encoded high-speed clock frequency $f_2$;
suppressing the common mode components in the first and second combined component associated with the second common mode encoded high-speed clock frequency $f_2$ and providing the differential mode components associated with the first differential mode encoded high-speed clock frequency $f_1$;
suppressing the in-phase and out of phase components in the first and second combined component associated with the first differential mode encoded high-speed clock frequency $f_1$ and providing the common mode component associated with the second common mode encoded high-speed clock frequency $f_2$;
amplifying the differential mode components associated with the first differential mode encoded high-speed clock frequency $f_1$ resulting in an amplified in-phase and out of phase component associated with the first differential mode encoded high-speed clock frequency $f_1$;
amplifying the common mode component associated with the second common mode encoded high-speed clock frequency $f_2$; and
selecting the differential amplifier or the common mode amplifier for performing the amplification operation.

23. The method of claim 22, wherein the common mode component associated with the second common mode encoded high-speed clock frequency $f_2$ is converted to an amplified differential mode component.

24. The method of claim 22 provides either the amplified differential mode components associated with the first differential mode encoded high-speed clock frequency $f_1$ or the differential mode component associated with the second common mode encoded high-speed clock frequency $f_2$ to a plurality of transceivers.

25. A two wire-based method of clock amplification comprising:
receiving a first combined component from a first wire of a two wire-based conductor bus and receiving a second combined component from a second wire of the two wire-based conductor bus, wherein:
the first combined component contains an in-phase component associated with a first high-speed clock frequency $f_1$ encoded in a differential mode and a common mode component associated with a second high-speed clock frequency $f_2$ encoded in a common mode,
the second combined component contains an out of phase component associated with the first differential mode encoded high-speed clock frequency $f_1$ and the common mode component associated with the second common mode encoded high-speed clock frequency $f_2$,
suppressing the common mode components in the first and second combined component associated with the second common mode encoded high-speed clock frequency $f_2$ and providing the differential mode components associated with the first differential mode encoded high-speed clock frequency $f_1$;
suppressing the in-phase and out of phase components in the first and second combined component associated with the first differential mode encoded high-speed clock frequency $f_1$ and providing the common mode component associated with the second common mode encoded high-speed clock frequency $f_2$;
amplifying the differential mode component associated with the first differential mode encoded high-speed clock frequency $f_1$ resulting in an amplified in-phase and out of phase component associated with the first differential mode encoded high-speed clock frequency $f_1$;
amplifying the common mode component associated with the second common mode encoded high-speed clock frequency $f_2$;
combining the amplified in-phase component associated with the first differential mode encoded high-speed clock frequency $f_1$ with the amplified common mode component associated with the second common mode encoded high-speed clock frequency $f_2$ resulting in a first amplified combined component; and combining the amplified out of phase component associated with the first differential mode encoded high-speed clock frequency $f_1$ with the amplified common mode component associated with the second common mode encoded high-speed clock frequency $f_2$ resulting in a second amplified combined component.

26. The method of claim 25, wherein the first amplified combined component is transmitted on the first wire of the two wire-based conductor bus.

27. The method of claim 25, wherein the second amplified combined component is transmitted on the second wire of the two wire-based conductor bus.

* * * * *

UNITED STATES PATENT AND TRADEMARK OFFICE
CERTIFICATE OF CORRECTION

Page 1 of 3

PATENT NO. : 10,749,663 B1
APPLICATION NO. : 16/565829
DATED : August 18, 2020
INVENTOR(S) : Marc-Andre Lacroix et al.

It is certified that error appears in the above-identified patent and that said Letters Patent is hereby corrected as shown below:

On the Title Page

In Item (54) and in the Specification, Column 1, Lines 1-5, "METHOD AND APPARATUS FOR SIMULTANEOUS PROPAGATION OF MULTIPLE CLOCKFREQUENCIES IN SERIALIZER/DESERIALIZER (SERDES) MACROS" should read -- METHOD AND APPARATUS FOR SIMULTANEOUS PROPAGATION OF MULTIPLE CLOCK FREQUENCIES IN SERIALIZER/DESERIALIZER (SERDES) MACROS --.

In the Drawings

Please replace FIGS. 3 and 6 with FIGS. 3 and 6 as shown on the attached pages.

Signed and Sealed this
Ninth Day of March, 2021

Drew Hirshfeld
*Performing the Functions and Duties of the
Under Secretary of Commerce for Intellectual Property and
Director of the United States Patent and Trademark Office*